(12) United States Patent
Moon et al.

(10) Patent No.: US 8,429,358 B2
(45) Date of Patent: Apr. 23, 2013

(54) METHOD AND DATA STORAGE DEVICE FOR PROCESSING COMMANDS

(75) Inventors: Kui-Yon Moon, Hwaseong-Si (KR); Moon-Wook Oh, Seoul (KR); Do-Geun Kim, Seoul (KR); Chan-Ik Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 352 days.

(21) Appl. No.: 12/657,029

(22) Filed: Jan. 11, 2010

(65) Prior Publication Data
US 2010/0153631 A1 Jun. 17, 2010

Related U.S. Application Data

(63) Continuation-in-part of application No. 12/015,548, filed on Jan. 17, 2008, now abandoned.

(30) Foreign Application Priority Data

Aug. 14, 2007 (KR) .................. 10-2007-0081832
Apr. 3, 2009 (KR) .................. 10-2009-0029091

(51) Int. Cl.
*G06F 12/00* (2006.01)

(52) U.S. Cl.
USPC .................. 711/156; 711/103; 711/E12.001

(58) Field of Classification Search .................. 711/103, 711/156, E12.001, 154, E12.008; 714/54, 714/11.054
See application file for complete search history.

(56) References Cited

U.S. PATENT DOCUMENTS

| | | | |
|---|---|---|---|
| 6,097,637 A | 8/2000 | Bauer et al. | 365/185.24 |
| 7,080,172 B1 * | 7/2006 | Schmalz | 710/104 |
| 7,334,107 B2 * | 2/2008 | Schoinas et al. | 711/207 |
| 7,433,246 B2 * | 10/2008 | Lee | 365/189.14 |
| 2002/0156985 A1 * | 10/2002 | Abhyankar et al. | 711/154 |
| 2008/0172520 A1 | 7/2008 | Lee | |
| 2008/0301342 A1 * | 12/2008 | Hofmann et al. | 710/105 |
| 2009/0049234 A1 | 2/2009 | Oh et al. | |
| 2010/0153632 A1 * | 6/2010 | Lee et al. | 711/103 |

OTHER PUBLICATIONS

Korean Patent Publication No. 1020010037694 to Jang, having Publication date of May 15, 2001 (w/ English Abstract page).
Korean Patent Publication No. 1020080067834 to Lee, having Publication date of Jul. 22, 2008 (w/ English Abstract page).

* cited by examiner

*Primary Examiner* — Pierre-Michel Bataille
(74) *Attorney, Agent, or Firm* — Monica H. Choi

(57) ABSTRACT

A data storage device for processing a command includes a host interface and a controller. The host interface stores program information sent within the command from a host. The controller decodes the program information that indicates a memory type to be accessed for the command. In addition, the controller determines whether the specified memory type can be accessed according to the command. The controller performs the command by accessing the memory type when the memory type specified by the program information is available for access.

20 Claims, 16 Drawing Sheets

516

| Register | Write Command Register Bytes | |
|---|---|---|
| Features | Memory Type [7:0] | ← BW1 |
| Sector Count | Sector Count [7:0] | ← BW2 |
| LBA Low | LBA[7:0] | ← BW3 |
| LBA Mid | LBA[15:8] | ← BW4 |
| LBA High | LBA[23:16] | ← BW5 |
| Device | Device Type[3:0], LBA[27:24] | ← BW6 |
| Command | Command Name[7:0] | ← BW7 |

| Register | Read Command Register Bytes | |
|---|---|---|
| Error | Error Type [7:0] | ← BR1 |
| Sector Count | Sector Count [7:0] | ← BR2 |
| LBA Low | LBA[7:0] | ← BR3 |
| LBA Mid | LBA[15:8] | ← BR4 |
| LBA High | LBA[23:16] | ← BR5 |
| Device | Device Type[3:0], LBA[27:24] | ← BR6 |
| Status | Status Name[7:0] | ← BR7 |

*FIG. 16*

| Feature Register[7:0] | Type of Memory |
|---|---|
| 0000_0000 | SLC |
| 0000_0001 | 2-bits MLC |
| 0000_0010 | 3-bits MLC |
| 0000_0011 | 4-bits MLC |
| 0000_0100 | DRAM |
| 0000_0101 | SRAM |

METHOD AND DATA STORAGE DEVICE FOR PROCESSING COMMANDS

CROSS-REFERENCE TO RELATED APPLICATION(S)

The present application is a CIP (continuation in part) of an earlier filed patent application with Ser. No. 12/015,548 filed on Jan. 17, 2008 now abandoned, for which priority is claimed. This earlier filed patent application with Ser. No. 12/015,548 is in its entirety incorporated herewith by reference.

The patent application with Ser. No. 12/015,548 and the present application claim priority under 35 USC §119 to Korean Patent Application No. 10-2007-0081832, filed on Aug. 14, 2007, in the Korean Intellectual Property Office, the disclosure of which is incorporated herein in its entirety by reference. A certified copy of Korean Patent Application No. 10-2007-0081832 is contained in the parent patent application with Ser. No. 12/015,548.

The present application also claims priority under 35 U.S.C. §119 to Korean Patent Application No. 10-2009-0029091, filed on Apr. 3, 2009, which is incorporated herein by reference in its entirety.

TECHNICAL FIELD

The present invention relates generally to processing commands in an electronic storage system such as a solid storage drive (SSD) for example, and more particularly, to a user specifying a memory type to be accessed for a command using program information in the command.

BACKGROUND

A solid state drive (SSD) is a data storage device that typically emulates a conventional hard disk drive (HDD), thus easily replacing the HDD in most applications. In contrast to the rotating disk medium of an HDD, an SSD utilizes solid state memory to store data. With no moving parts, an SSD largely eliminates seek time, latency and other electro-mechanical delays and failures associated with a conventional HDD.

An SSD is commonly composed of either NAND flash (non-volatile) or SDRAM (volatile).

SSDs based on volatile memory such as SDRAM are characterized by fast data access and are used primarily to accelerate applications that would otherwise be held back by the latency of disk drives. The volatile memory of the DRAM-based SSDs typically requires the inclusion of an internal battery and a backup disk system to ensure data persistence. If power is lost, the battery maintains power for sufficient duration of copy data from the SDRAM to the backup disk system. Upon restoration of power, data is copied back from the backup disk to SDRAM, at which time the SSD resumes normal operations.

However, most SSD manufacturers use non-volatile flash memory to create more rugged and compact alternatives to DRAM-based SSDs. These flash memory-based SSDs, also known as flash drives, do not require batteries, allowing makers to more easily replicate standard hard disk drives. In addition, non-volatile flash SSDs retain memory during power loss.

As is well known in the art, single-level cell (SLC) flash is capable of storing one bit per memory cell, while multi-level cell (MLC) flash is capable of storing two or more bits per memory cell. As such, in order to increase capacity, flash SSDs may utilize multi-level cell (MLC) memory banks. However, flash SSDs generally suffer from relatively slow random write speeds, and this operational drawback is further exasperated with relatively slow speeds of MLC flash. As such, it has been suggested to equip SSDs with two types of flash storage media—lower capacity SLC memory banks and higher capacity MLC memory banks. With such a configuration, frequently used data (e.g., directory and/or log information) can be stored in the faster SLC banks, while less frequently used data (e.g., music files, images, etc.) can be stored in the slower MLC banks.

In addition, a user may desire to control the type of data storage device for writing data. For example, the user may wish to write frequently used data or data requiring higher reliability into the lower capacity SLC memory device. In contrast, the user may wish to write less frequently used data or data requiring less reliability into the higher capacity MLC memory device.

SUMMARY OF THE INVENTION

Accordingly, in a general aspect of the present invention, a user specifies the type of memory device for storing data via a command sent to a data storage device from a host.

In a method and a data storage device for processing a command according to an aspect of the present invention, the data storage device includes a host interface and a controller. The host interface stores program information sent within the command from a host. The controller decodes the program information that indicates a memory type to be accessed for the command. In addition, the controller determines whether the specified memory type can be accessed according to the command. The controller performs the command by accessing the memory type when the memory type specified by the program information is available for access.

In another embodiment of the present invention, the data storage device further includes a status register for storing an indication of an error when the memory type specified by the program information is not available for access according to the command.

In a further embodiment of the present invention, the host reads the status register with the indication of the error. The host sends modified program information for indicating an alternative memory type to be accessed for the command after the host reads the error in the status register.

In another embodiment of the present invention, the controller selects an alternative memory type that is available to be accessed for performing the command when the status register is set to indicate the error. In that case, the controller performs the command by accessing the alternative memory type.

In an example embodiment of the present invention, the status register is a read command register.

In a further embodiment of the present invention, the command is sent from the host to the data storage device via the host interface that is a high speed serial interface. In that case, the read command register is within the high speed serial interface.

In another embodiment of the present invention, the program information is stored in a features field within a write command register.

In an example embodiment of the present invention, the command is sent from the host to the data storage device via the host interface that is a high speed serial interface. In that case, the write command register is within the high speed serial interface. For instance, the high speed serial interface is for one of a SATA interface, a SAS interface, or a PCI express interface.

In another embodiment of the present invention, the program information is embedded into a reserved field of a data packet sent from the host according to a PCI express interface standard.

In a further embodiment of the present invention, the program information indicates access to one of a plurality of MLC (multi level cell) flash memory types or a SLC (signal level cell) flash memory type within a solid state drive.

In another embodiment of the present invention, the program information indicates access to one of a SLC (signal level cell) flash memory type, a plurality of MLC (multi level cell) flash memory types, or a random access memory type for the command.

In this manner, the user specifies the memory type to be accessed by entering the program information into the command. The controller further processes the command depending on whether the selected memory type is available for such access. Thus, the command is processed according to the specification of the user.

These and other features and advantages of the present invention will be better understood by considering the following detailed description of the invention which is presented with the attached drawings.

BRIEF DESCRIPTION OF THE DRAWINGS

FIG. 15 illustrates a write command register in a host interface of the data storage device of FIG. 12, according to an example embodiment of the present invention;

FIG. 16 illustrates a read command register in the host interface of the data storage device of FIG. 12, according to an example embodiment of the present invention;

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20, 21, 22, 23, and 24 refer to elements having similar structure and/or function.

DETAILED DESCRIPTION

The present invention will now be described by way of preferred, but non-limiting, embodiments of the invention. It is emphasized here that the invention is not limited by the exemplary embodiments described below, and that instead the scope of the invention is delimited by the appended claims.

Figure 1:
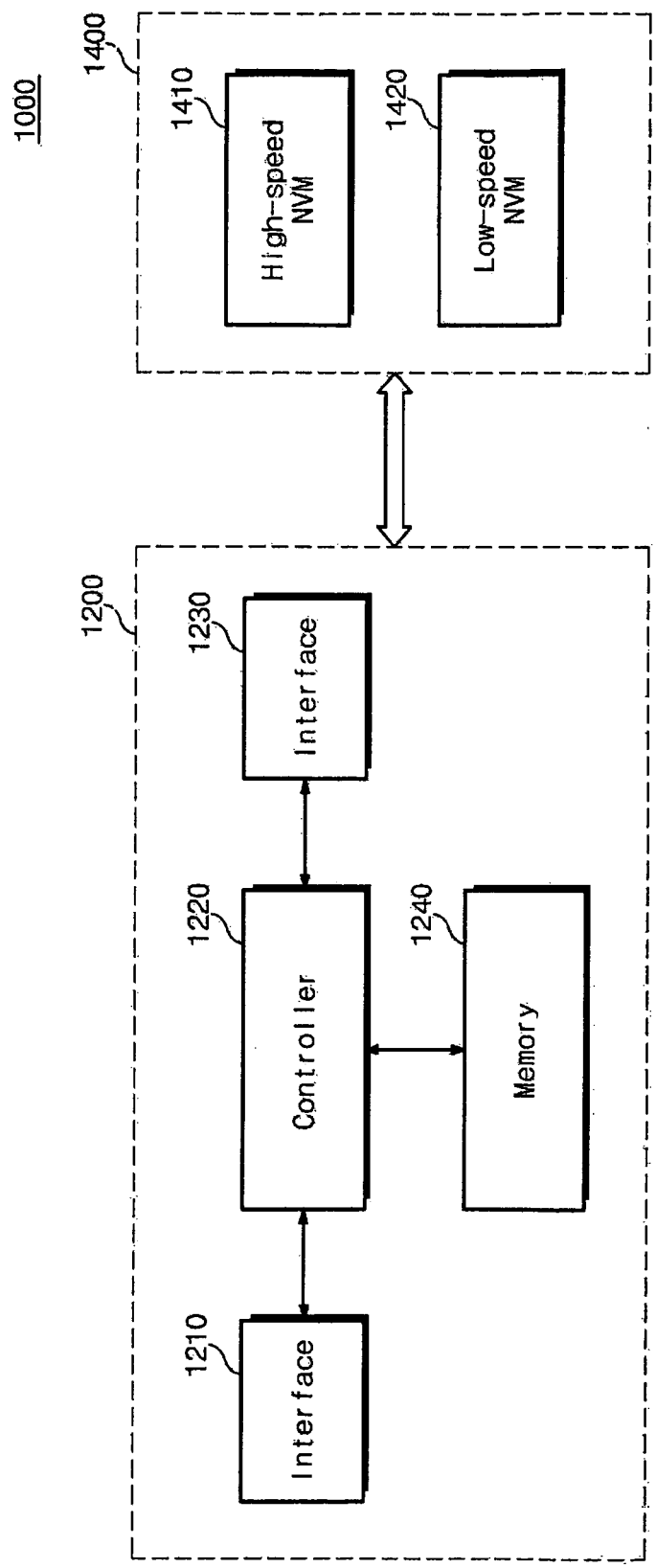
FIG. 1 is a block diagram of a solid state drive (SSD) according to an embodiment of the present invention.

FIG. 1 illustrates a block diagram of a solid state drive (SSD) 1000 according to an embodiment of the present invention. As shown, the SSD 1000 of this example includes an SSD controller 1200 and non-volatile storage media 1400.

The SSD controller 1200 includes first and second interfaces 1210 and 1230, a controller 1220, and a memory 1240.

The first interface 1210 functions as a data I/O interface with a host device, such as a host central processing unit (CPU) (not shown). Non-limiting examples of the first interface 1210 include Universal Serial Bus (USB) interfaces, Advanced Technology Attachment (ATA) interfaces, Serial ATA (SATA) interfaces, Small Computer System Interface (SCSI) interfaces.

The second interface 1230 functions as a data I/O interface with the non-volatile storage media 1400. In particular, the second interface 1230 is utilized to transmit/receive various commands, addresses and data to/from the non-volatile storage media 1400. As will be apparent to those skilled in the art, a variety of different structures and configurations of the second interface 1230 are possible, and thus a detailed description thereof is omitted here for brevity.

The controller 1220 and memory 1240 are operatively connected between the first and second interfaces 1210 and 1230, and together function to control/manage the flow of data between the host device (not shown) and the non-volatile storage media 1400. The memory 1240 may, for example, be a DRAM type of memory device, and the controller 1220 may, for example, include a central processing unit (CPU), a direct memory access (DMA) controller, and an error correction control (ECC) engine. Examples of controller functionality may be found in commonly assigned U.S. Patent Publication 2006-0152981, which is incorporated herein by reference. The operations generally executed by controller 1220 (and memory 1240) to transfer data between the host device (not shown) and SSD memory banks are understood by those skilled in the art, and thus a detailed description thereof is omitted here for brevity. Rather, the operational description presented later herein is primarily focused on inventive aspects relating to various embodiments of the invention.

Still referring to FIG. 1, the non-volatile storage media 1400 of this example includes a high-speed non-volatile memory (NVM) 1410 and a low-speed non-volatile memory (NVM) 1420. As the names suggest, the high-speed NVM 1410 is capable of operating at a relatively higher speed (e.g., random write speed) when compared to the low-speed NVM 1420.

In an exemplary embodiment, the high-speed NVM 1410 is single-level cell (SLC) flash memory, and the low-speed NVM 1420 is multi-level cell (MLC) flash memory. However, the invention is not limited in this respect. For example, the high-speed NVM 1410 may instead be comprised of phase-change random access memory (PRAM), or MLC flash memory in which one bit per cell is utilized. Also, the high-speed NVM 1410 and the low-speed NVM 1420 may be comprised of the same type of memory (e.g., SLC or MLC or PRAM), where the operational speed is differentiated by fine-grain mapping in the high-speed NVM 1410 and coarse-grain mapping in the low-speed NVM 1420.

Generally, the high-speed NVM 1410 is utilized to store frequently accessed (written) data such as meta data, and the low-speed NVM 1420 is utilized to store less frequently accessed (written) data such as media data. In other words, as will discussed later herein, a write frequency of data in the high-speed NVM 1410 is statistically higher than a write frequency of data in the low-speed NVM 1420. Also, due to the nature of the respective data being stored, the storage capacity of the low-speed NVM 1420 will typically be much higher than that of the high-speed NVM 1410.

In an exemplary embodiment, the high-speed NVM 1410 is hidden from an external operating system connected to the SSD. This aspect of the embodiment is illustrated in FIGS. 2 and 3.

Figure 2:
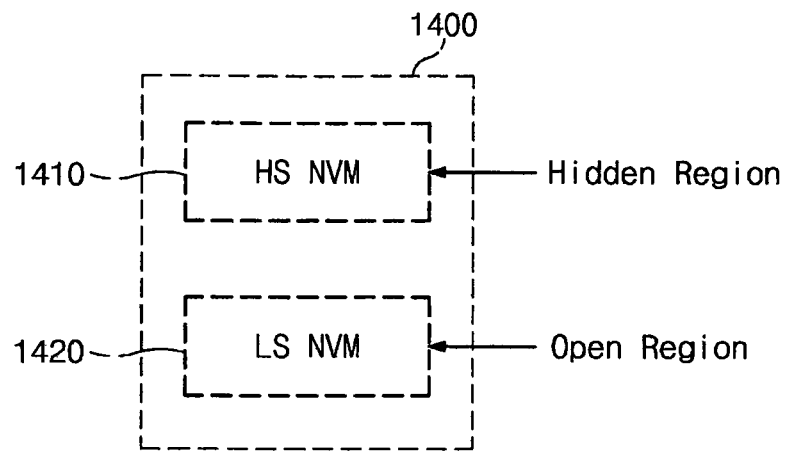
FIGS. 2 and 3 are block diagrams for describing a non-volatile storage media in the SSD of FIG. 1 according to an embodiment of the present invention.
Figure 3:
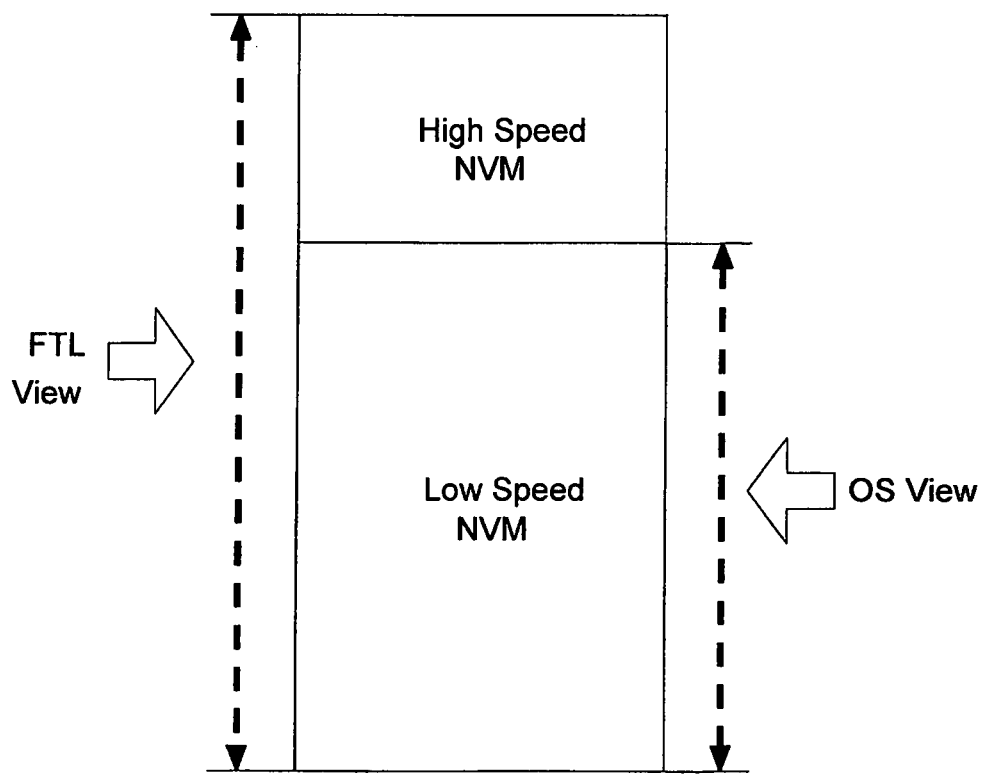

Referring collectively to FIGS. 2 and 3, the high-speed NVM 1410 of the example of this embodiment is a hidden region—that is, the high-speed NVM 1410 is cannot be seen (directly addressed) by the external operating system (OS). Rather, the address space shown relative to the OS view is only the low-speed NVM 1420. On the other hand, the address space shown relative to the Flash Translation Layer (FTL) is both the high-speed NVM 1410 and the low-speed NVM 1420. The FTL translates an address provided by the OS into a physical address of the non-volatile storage media 1400 (i.e., a physical address within the high-speed NVM 1410 or the low-speed NVM 1420).

Figure 4:
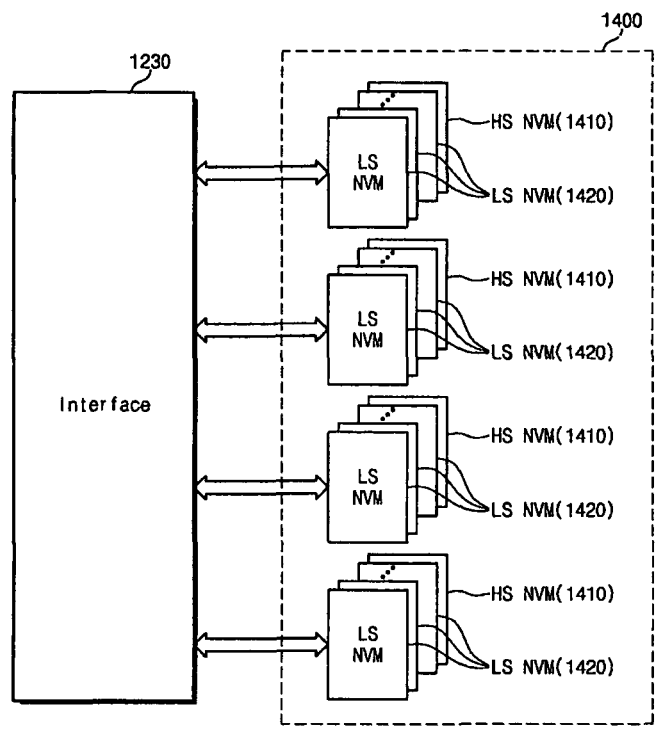
FIGS. 4 and 5 are block diagrams for describing alternative ways of coupling a non-volatile storage media to an interface in the SSD of FIG. 1 according to embodiments of the present invention.
Figure 5:
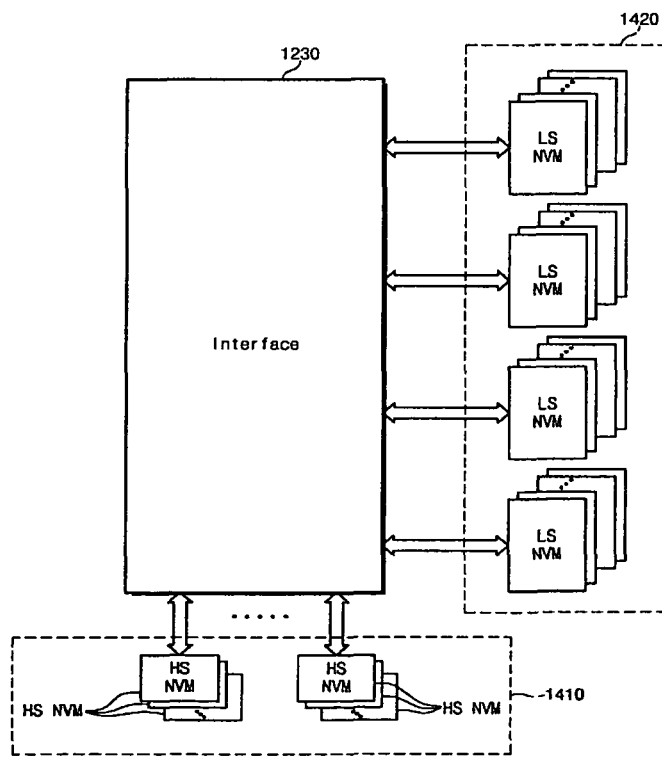

Turning to the block diagrams of FIGS. 4 and 5, there are a number of different ways in which the high-speed NVM 1410 and the low-speed NVM 1420 can be operative connected to the controller 1220 (FIG. 1) via the interface 1230. In the example of FIG. 4, the high-speed NVM 1410 and the low-speed NVM 1420 communicate via the interface 1230 using common interface channels. In the example of FIG. 5, the high-speed NVM 1410 and the low-speed NVM 1420 communicate via the interface 1230 using separate interface channels.

It is again noted, however, that the high-speed NVM 1410 and the low-speed NVM 1420 need not be composed of different types of memory. That is, a single type of memory may be operationally segregated into a high-speed layer and a low-speed layer. For example, the grain mapping in the two layers may differ, or the number of bits utilized per cell in the two layers may differ. Further, the high-speed memory layer and the low-speed memory layer may be segregated at the chip level (e.g., contained in different memory chips), or within the same memory chip (e.g., contained in different memory blocks or groups of memory cells of the same memory chip).

An operational description of the SSD according to embodiments of the present invention is presented next.

According to an embodiment of the present invention in which data is stored in the SSD, a first assessment is executed to determine whether received data is hot data or cold data. As will be understood by those skilled in the art, "hot" data is a term of art that refers to data which is frequently written or updated (requiring write access), such a directory information and/or logging information. "Cold" data is all other data, i.e., data which is not frequently written or updated, such as image files, sound files, program code and so on. Cold data may be written once or infrequently, but read frequently. Thus, it is the frequency of write access that separates hot data from cold.

Received data which is assessed as hot data during the first assessment is stored in the high-speed NVM 1410, and received data which is first assessed as cold data during the first assessment is stored in the low-speed NVM 1420.

Then, a second assessment is executed to determine whether the data stored in the high-speed NVM 1410 is hot data or cold data. In other words, the data stored in the high-speed NVM 1410 reassessed to determine with the data should be reclassified as cold data. Data which is then assessed as cold data during the second assessment is migrated from the high-speed NVM 1410 to the low-speed NVM 1420.

By periodically migrating data which initially determined to be hot data from the high-speed NVM 1410 to the low-speed NVM 1420, the size of the high-speed NVM 1410 can be reduced. This can potentially result in cost savings, and increase the overall storage capacity of the SSD (e.g., by allowing for more space for the high-capacity MLC layer).

The second assessment and migration of data to the low-speed NVM 1420 can be programmed to occur, for example, when the unused capacity of the high-speed NVM 1410 is less than a preset value. Alternately, for example, the second assessment and migration of data to the low-speed NVM 1420 can be programmed to occur at given periodic intervals, or when the SSD is idle. Examples of an idle state may include periods in which no read/write request is received from the host, or when the activation ratio or intensity of read/write requests is less than a threshold.

Figure 6:
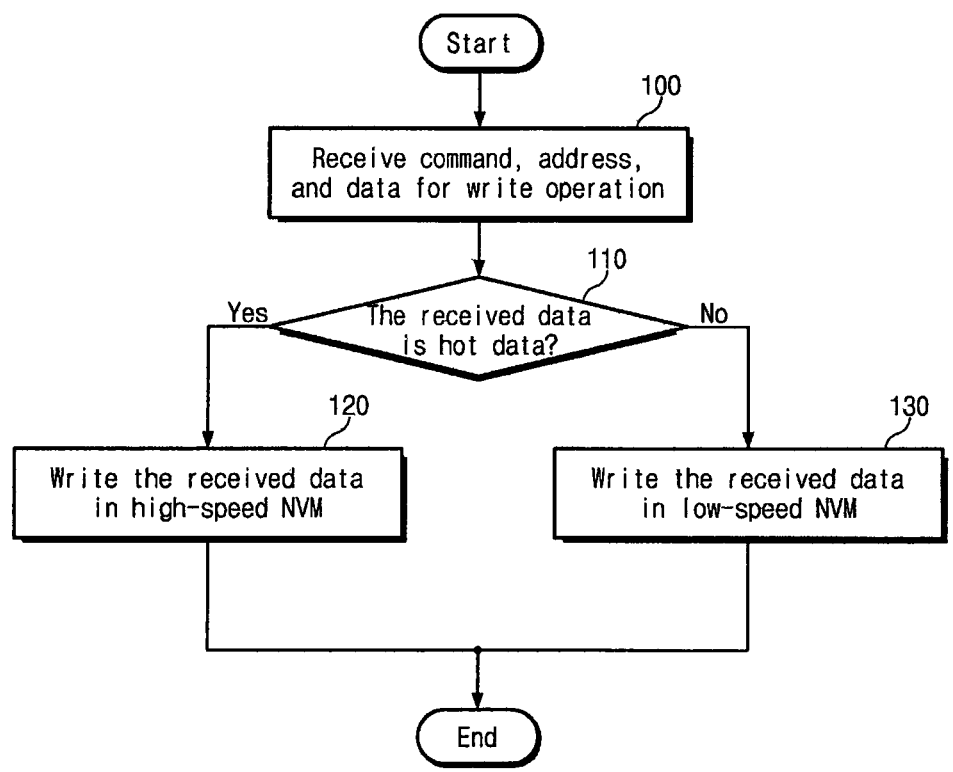
FIGS. 6 through 8 are flow charts for use in describing methods of allocating data to regions of a non-volatile storage media in the SSD of FIG. 1 according to embodiments of the present invention.

FIG. 6 is a flow chart for use in describing the first assessment and storage (write) of data in the SSD according to an embodiment of the present invention.

Initially, at step 100, a write command, an address and data are received. Then, at step 110, a determination is made as to whether the received data is classified as hot data. If the received data is classified as hot data, the received data is stored in the high-speed NVM 1410 at step 120. On the other hand, if the received data is not classified as hot data, the received data is stored in the low-speed NVM 1420 at step 130.

It should be noted that data stored in the low-speed NVM 1420 at step 130 may first be "passed through" the high-speed NVM 1410. In other words, the data may first be briefly (temporarily) stored in the high-speed NVM 1410, and then stored in the low-speed NVM. In this case, the high-speed NVM 1410 essentially acts as a memory buffer for the low-speed NVM 1420.

Figure 7:
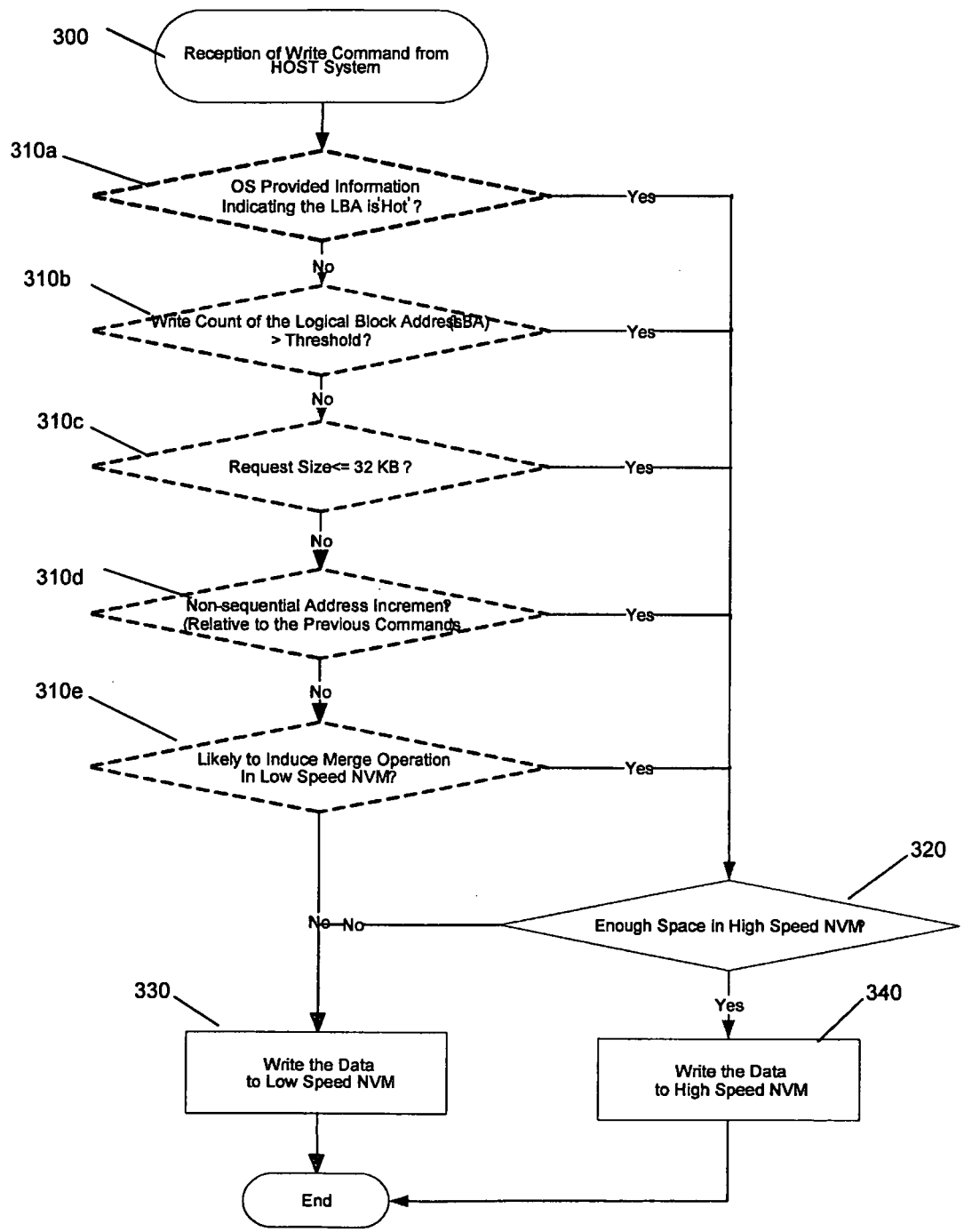

FIG. 7 is a flow chart for use in describing the first assessment and storage (write) of data in the SSD according to another embodiment of the present invention.

Initially, at step 300, a write command, an address and data are received. Then, at steps 310a through 310e, a determination is made as to whether the received data is to be classified as hot data. If the received data is classified as hot data, and if there is sufficient available space in the high-speed NVM 1410 (step 320), the received data is stored in the high-speed NVM 1410 at step 340. On the other hand, if the received data is not to be classified as hot data, or if there is insufficient available space in the high-speed NVM 1410, the received data is stored in the low-speed NVM 1420 at step 330.

There are a number of different ways in which the received data might be classified as hot data, and steps 310a through 310e of FIG. 7 represent a non-exhaustive list of decision processes which can be used in the classification. These steps can be used in combinations of two or more, or individually, depending on the desired level of accuracy in the first assessment of the received data.

At step 310a, a determination is made as to whether the operating system (OS) has provided information that the data is hot data. If so, the data is classified as hot data, and the process proceeds to step 320.

At step 310b, a determination is made as to whether the write count of the logical block address has exceeded a predetermined threshold. If so, the data is classified as hot data, and the process proceeds to step 320.

At step 310c, a determination is made as to whether the request size of the data is less then predetermined threshold (e.g., less than 32 KB). If so, the data is classified as hot data, and the process proceeds to step 320.

At step 310d, a determination is made as to whether there is a non-sequential address increment relative to the previously received command. If so, the data is classified as hot data, and the process proceeds to step 320.

At step 310e, a determination is made as to whether a merge operation is likely to be induced in the low-speed NVM. If so, the data is classified as hot data, and the process proceeds to step 320.

Although not shown in FIG. 7, in the case where insufficient space exists in the high-speed NVM (step 320), and alternative would be to create available space by migrating already stored cold data of the high-speed NVM to the low-speed NVM, and then storing the new hot data in the high-speed NVM.

Also, with reference to above-described processes of FIGS. 6 and 7, it is noted that the embodiments thereof are not limited to storing all of the hot and cold data in the high-speed and low-speed NVMs, respectively. For example, some of the data initially assessed as cold data may be stored in the high-speed NVM. Also, though less preferable, some of the data initially assessed as hot data may be stored in the low-speed NVM.

Figure 8:
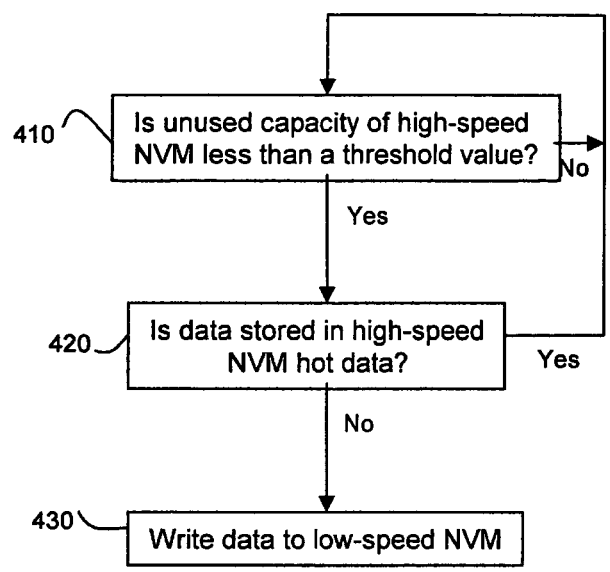

FIG. 8 is a flow chart for use in describing an example of the second assessment and migration of data to the low-speed NVM in the SSD according to an embodiment of the present invention.

Initially, at step 410, a determination is made as to whether an unused memory capacity of the high-speed NVM is less than a predetermined threshold value. As suggested previously, this step can be supplemented with (or replaced with) a periodic execution step in which step 410 (or step 420 below) is executed at periodic intervals, and/or with a SSD idle determination step in which step 410 (or step 420) is executed at periodic intervals.

Next, at step 420, a determination is made as to whether data stored in the high-speed NVM is hot data, i.e., whether the data may be reclassified as cold data.

Then, at step 430, reclassified cold data which stored in the high-speed NVM is migrated to the low-speed NVM.

There are a number of different ways in which the determination of step 420 may be executed. For example, it is possible to examine the write count value of each valid data in the high-speed NVM, and to then reclassify data having low write counts as cold data. Alternately, it is possible to carry out a FIFO-type assessment in which old (first come) valid data is reclassified as cold data.

With reference to above-described process of FIG. 8, it is noted that the embodiment thereof is not limited to migrating all of the cold data to the low-speed NVM. For example, some of the data assessed as cold data may be retained in the high-speed NVM.

Figure 9:
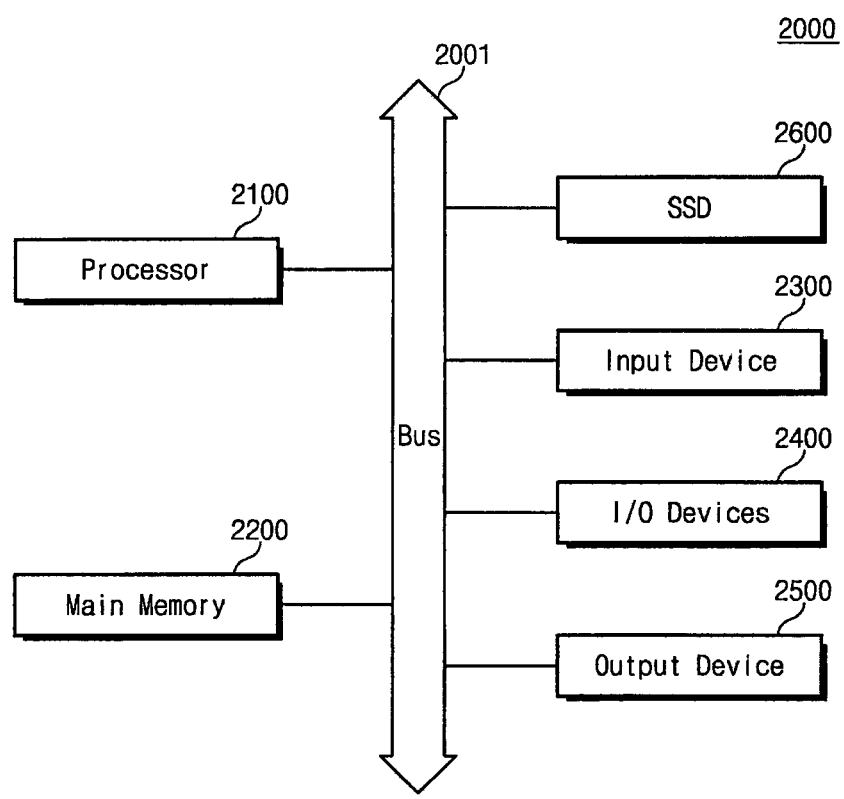
FIG. 9 is a block diagram of the computer system including an SSD according to an embodiment of the present invention.

FIG. 9 is a block diagram of a computer system according to an embodiment of the present invention. As shown in the figure, a processor (host) 2100 and main memory 2200 communicate over a data bus 2001. Also connected to the bus 2001 are an output device 2500 (e.g., display), an input device 2300 (e.g., keyboard), other I/O devices 2400, and a solid state drive SSD. The solid state drive is configured according to one or more of the previously described embodiments of the invention.

Figure 10:
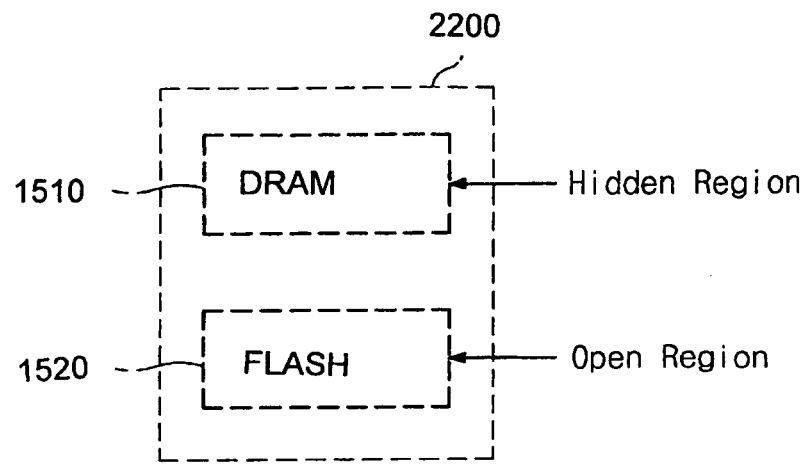
FIGS. 10 and 11 are block diagrams of a main memory according to embodiments of the present invention.
Figure 11:
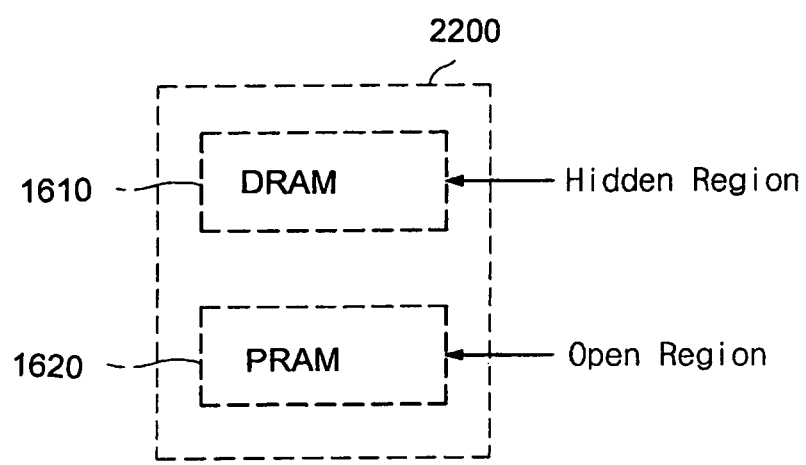

Embodiments of the present invention have been described primarily in the context of solid state drives (SSDs). However, the invention is not limited to SSD applications. For example, FIG. 10 illustrates an embodiment where the high-speed memory layer and the low speed memory layer constitute the main memory 2200 of the computer system shown in FIG. 9. In FIG. 10, the high-speed memory layer 1510 includes DRAM cells and may be a hidden region relative to the processor 2100 of FIG. 9. The low-speed memory layer 1520 of FIG. 10 includes flash cells (either SLC or MLC) and may be open relative to the processor 2100 of FIG. 9. FIG. 11 illustrates another example of a main memory 2200. As shown, the high-speed memory layer 1610 includes DRAM cells and may be a hidden region relative to the processor 2100 of FIG. 9, and the low-speed memory layer 1620 includes phase-change random access memory (PRAM) cells and may be open relative to the processor 2100 of FIG. 9.

Figure 12:
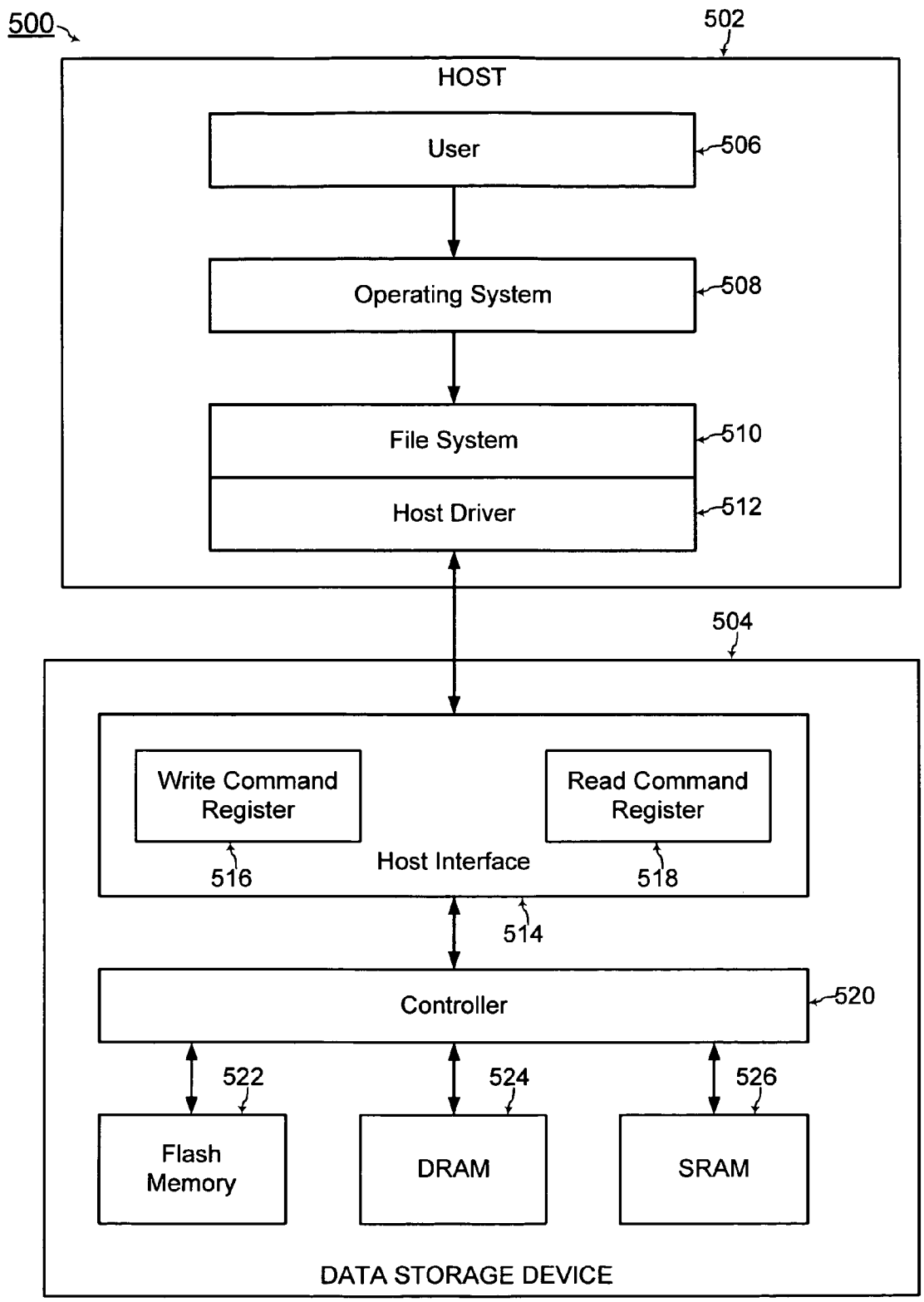
FIG. 12 shows a block diagram of an electronic system having a host and a data storage device for processing a command from the host according to an example embodiment of the present invention.

FIG. 12 shows a block diagram of an electronic system 500 having a host 502 and a data storage device 504 for processing a command from the host 502 according to an example embodiment of the present invention. The host 502 includes a user 506 such as an application program for example that is capable of specifying the memory type to be accessed for a command. The host 502 further includes an operating system 508, a file system 510, and a host driver 512.

The data storage device 504 includes a host interface 514 with a write command register 516 and a read command register 518. The data storage device 504 further includes a controller 520 along with multiple memory types such as a flash memory device 522, a DRAM (dynamic random access memory) device 524, and a SRAM (static random access memory) device 526. The flash memory device 522 forms a SSD (solid date drive) of the electronic system 500, according to an example embodiment of the present invention.

Figure 13:
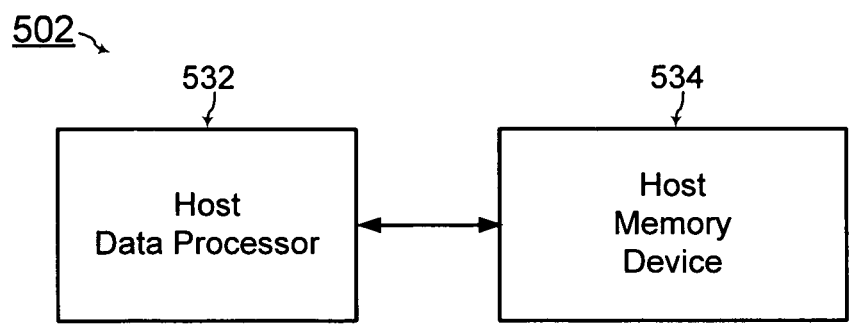
FIG. 13 shows a block diagram of components for implementing the components in the host of FIG. 12, according to an example embodiment of the present invention.

FIG. 13 shows a block diagram of further components of the host 502, according to an example embodiment of the present invention. The host 502 includes a host data processor 532 and a host memory device 534 having sequence of instructions (i.e., software) stored thereon. Execution of such sequence of instructions by the host data processor 532 causes the host data processor 532 to performs the steps/functions of the user 506, the operating system 508, the file system 510, and the host driver 512, as described herein with reference to FIGS. 22, 23, and 24.

Figure 14:
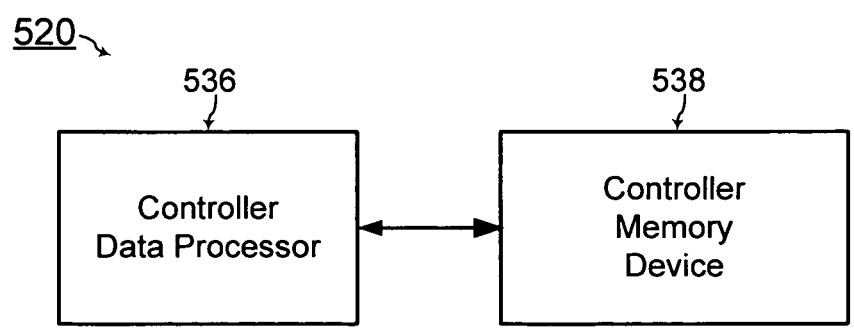
FIG. 14 shows a block diagram of components for implementing a controller in the data storage device of FIG. 12, according to an example embodiment of the present invention.

FIG. 14 shows a block diagram of the controller 520 in the data storage device 504, according to an example embodiment of the present invention. The controller 520 includes a controller data processor 536 and a controller memory device 538 having sequence of instructions (i.e., software) stored thereon. Execution of such sequence of instructions by the controller data processor 536 causes the controller data processor 536 to performs the steps/functions of the controller 536, as described herein with reference to FIGS. 22, 23, and 24.

Operation of the host 502 and the data storage device 504 is now described with reference to the flowcharts of FIGS. 22, 23, and 24. Referring to FIGS. 12 and 24, the user specifies a command for accessing the data storage device 504 (step S21 of FIG. 24). In addition, the user specifies a memory type to be accessed in the data storage device 504 for the command (step S21 of FIG. 24).

The operating system 508 and the file system 510 transmit such command information from the user 506 to the host driver 512 (step S22 of FIG. 24). The host driver 512 generates the command including program information indicating the user-specified memory type to the host interface 514 (step S23 of FIG. 24). In an example embodiment of the present invention, the host interface 514 is a high speed serial interface such as a SATA (serial advanced technology attachment) interface, a SAS (serial attached SCSI) interface, or a PCI (peripheral component interconnect) express interface.

The host interface 514 stores the command with the program information into a command register such as the write command register 516 for example when the command is for writing to the data storage device 504 (step S24 of FIG. 24). The controller 520 then decodes and executes such a command as stored in the write command register 516 (step S25 of FIG. 24).

Figure 22:
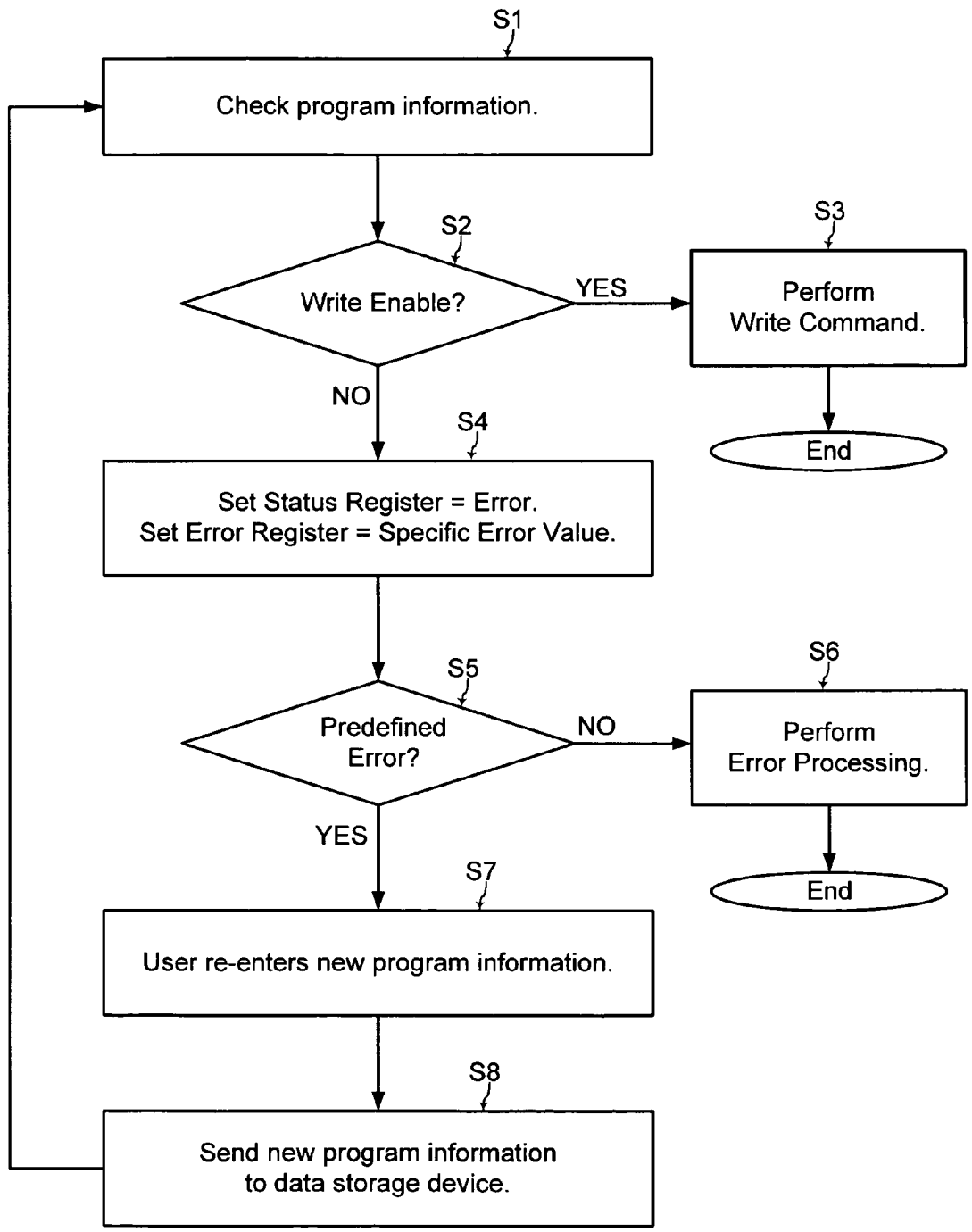
FIG. 22 shows a flowchart of steps during operation of the data storage device of FIG. 12, according to an example embodiment of the present invention.

The flowchart of FIG. 22 shows more detailed steps for executing the command in step S25 of FIG. 24. Referring to FIGS. 12 and 22, the controller 520 checks the program information of the command as stored in the write command register 516. FIG. 15 illustrates example contents of the write command register 516.

In the prior art, a first byte BW1 of the write command register 516 is reserved as a features field and is not used for a write command according to the high speed serial interface protocol. According to an aspect of the present invention, the features field is used for storing the program information specified by the user 506 for indicating the memory type for storing the data of the command.

Further referring to FIG. 15, a second byte BW2 of the write command register 516 is for indicating a sector count. In addition, third, fourth, and fifth bytes BW3, BW4, and BW5 and a portion of a sixth byte BW6 form a logical block address for the write command. Another portion of the sixth byte BW6 is for indicating a device type associated with the write command. A seventh byte BW7 is for indicating a command name. Such fields for the sector count, the logical block address, the device type, and the command name are generally and individually known to one of ordinary skill in the art of high speed serial interfaces.

Referring back to FIGS. 12, 15, and 22, the controller 520 reads the program information from the features field BW1 (step S1 of FIG. 22) that indicates the memory type to be accessed for the command. The program information of the command indicates accessing one of the DRAM device 524, the SRAM device 526, or a portion of the flash memory device 522.

Figures 17, 18:
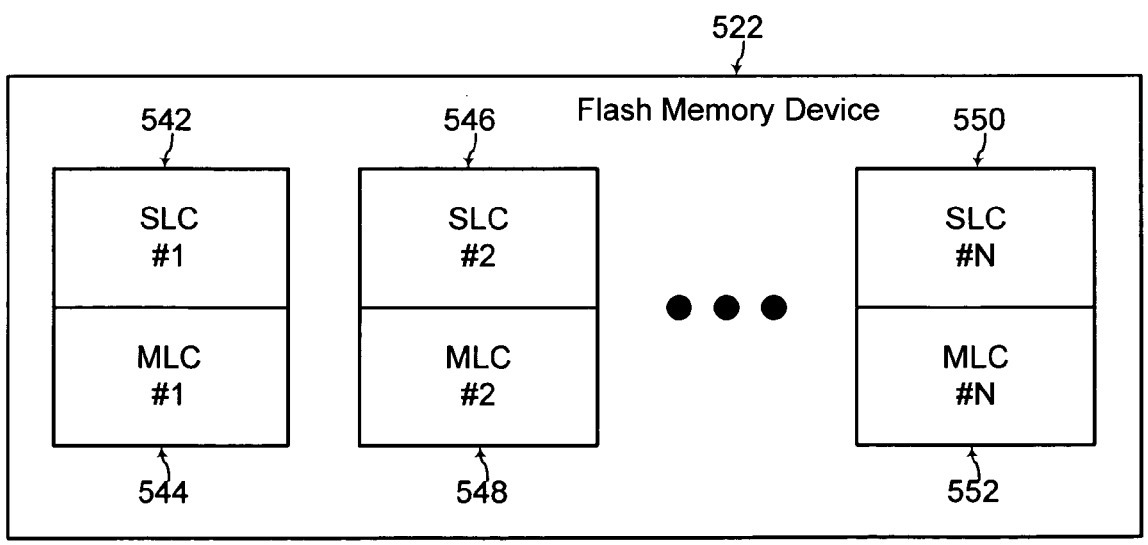
FIG. 17 illustrates a table of example bit patterns for specifying different memory types for a command, according to an example embodiment of the present invention.
FIGS. 18 and 19 illustrate example memory devices with SLC (single level cell) and MLC (multi level cell) memory portions, according to example embodiments of the present invention.

FIG. 17 shows example bit patterns for the first byte BW1 of the features field forming the program information. In the example of FIG. 17, a bit pattern of "00000000" indicates access to a SLC (single level cell) portion of the flash memory device 522. Alternatively in FIG. 17, a bit pattern of "00000001" indicates access to a 2-bits MLC (multi level cell) portion with each cell storing 2-bits in the flash memory device 522. Also in FIG. 17, a bit pattern of "00000010" indicates access to a 3-bits MLC (multi level cell) portion with each cell storing 3-bits in the flash memory device 522.

Furthermore in FIG. 17, a bit pattern of "00000011" indicates access to a 4-bits MLC (multi level cell) portion with each cell storing 4-bits in the flash memory device 522. Also in FIG. 17, a bit pattern of "00000100" indicates access to the DRAM device 524, and a bit pattern of "00000101" indicates access to the SRAM device 526.

FIG. 18 shows an example configuration of the flash memory device 522 having a first SLC (single level cell) portion 542 and a first MLC (multi level cell) portion 544 formed as a first integrated circuit chip. The flash memory device 522 also includes a second SLC (single level cell) portion 546 and a second MLC (multi level cell) portion 548 formed as a second integrated circuit chip, and includes an Nth SLC (single level cell) portion 550 and an Nth MLC (multi level cell) portion 552 formed as an Nth integrated circuit chip. Each of the MLC portions 544, 548, and 552 is comprised of respective cells that store 2-bits per cell, 3-bits per cell, or 4-bits per cell. Each of the SLC portions 542, 546, and 550 is comprised of respective cells that store 1-bit per cell.

Figure 19:
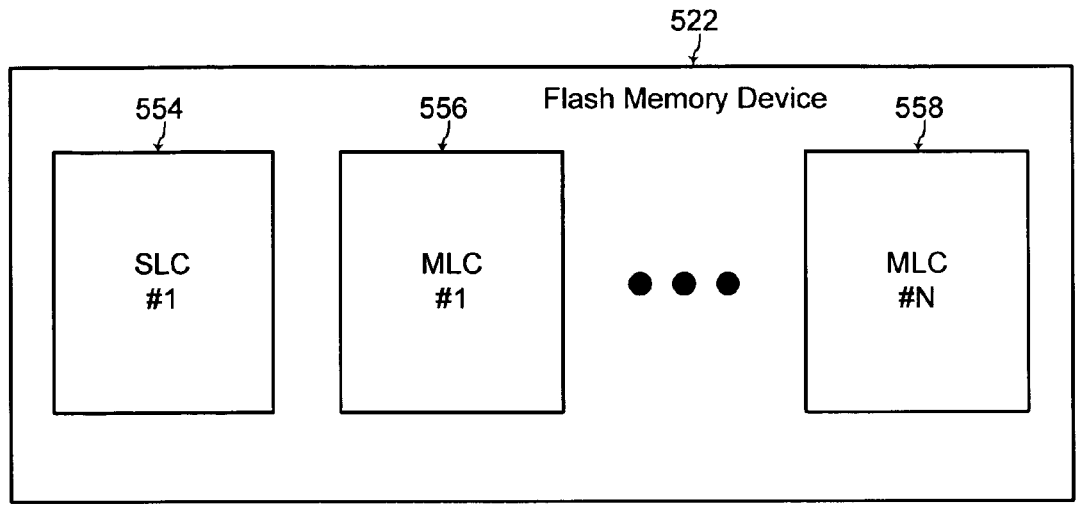

FIG. 19 shows another example configuration of the flash memory device 522 having a SLC (single level cell) memory integrated circuit chip 542. The flash memory device 522 of FIG. 19 also includes a first MLC (multi level cell) memory integrated circuit chip 556 and an Nth MLC (multi level cell) memory integrated circuit chip 558. Each of the MLC integrated circuit chips 556 and 558 is comprised of respective cells that store 2-bits per cell, 3-bits per cell, or 4-bits per cell. The SLC integrated circuit chip 554 is comprised of cells that store 1-bit per cell. FIGS. 18 and 19 show examples of the flash memory device 522 forming an SSD (solid storage drive) of the electronic system 500 of FIG. 12, according to an example embodiment of the present invention.

Referring back to FIGS. 12 and 22, the controller 520 decodes the bits of the program information to determine which memory type is being accessed for the command (step S1 of FIG. 22), such as according to the table of FIG. 17 for example. The controller 520 further checks for whether the specified memory type is available for access (step S2 of FIG. 22).

For the example of the write command, the controller 520 determines whether the specified memory type has sufficient capacity for storing the data of the write command. If the specified memory type is available for access, a write enable is activated, and the command is performed by accessing the specified memory type (step S3 of FIG. 22) for completion of the command processing.

Alternatively, if the controller 520 determines that the specified memory type is not available for access, the write enable is deactivated, and the controller 520 indicates an error in the read command register 518 that is an example status register (step S4 of FIG. 22). FIG. 16 illustrates example contents of the read command register 518. A first byte BR1 of the read command register 518 is reserved as an error field for indicating an error type that has occurred for the command.

Further referring to FIG. 16, a second byte BR2 of the read command register 518 is for indicating the sector count. In addition, third, fourth, and fifth bytes BR3, BR4, and BR5 and a portion of a sixth byte BR6 form the logical block address for the command. Another portion of the sixth byte BR6 is for indicating the device type associated with the command. A seventh byte BR7 is for indicating a status name for the command.

Referring to FIGS. 12, 16, and 22, when the controller 520 determines that the specified memory type is not available for access (step S2 of FIG. 22), the controller 520 sets the status name BR7 field to indicate that an error for the command has occurred (step S4 of FIG. 22). In addition, the controller 520 sets the error type BR1 field to a specific error value for indicating that the memory type is not available (step S4 of FIG. 22).

If the error type BR1 field indicates an error different from a predefined error that the specified memory type is not accessible (step S5 of FIG. 22), the controller 520 or the host 502 performs error processing for that error type that is not the predefined error (step S6 of FIG. 22) for completion of the command processing. Alternatively, if the error type BR1 field indicates the predefined error that the specified memory type is not accessible (step S5 of FIG. 22), the user 506 of the host 502 is notified to re-enter new program information for indicating a corresponding new memory type that may be accessible (step S7 of FIG. 22). The host 502 reads the predefined error in the read command register 518 and controls the user 506 to re-enter modified program information.

The host driver 512 sends such new program information to the features field BW1 of the write command register 516 (step S8 of FIG. 22). The flowchart of FIG. 22 then returns to step S1 to be performed with the new program information in the write command register 516. In this manner in FIG. 22, the user 506 sends modified program information to specify a series of alternative memory types until a specified memory type is available for access for the current command.

Figure 23:
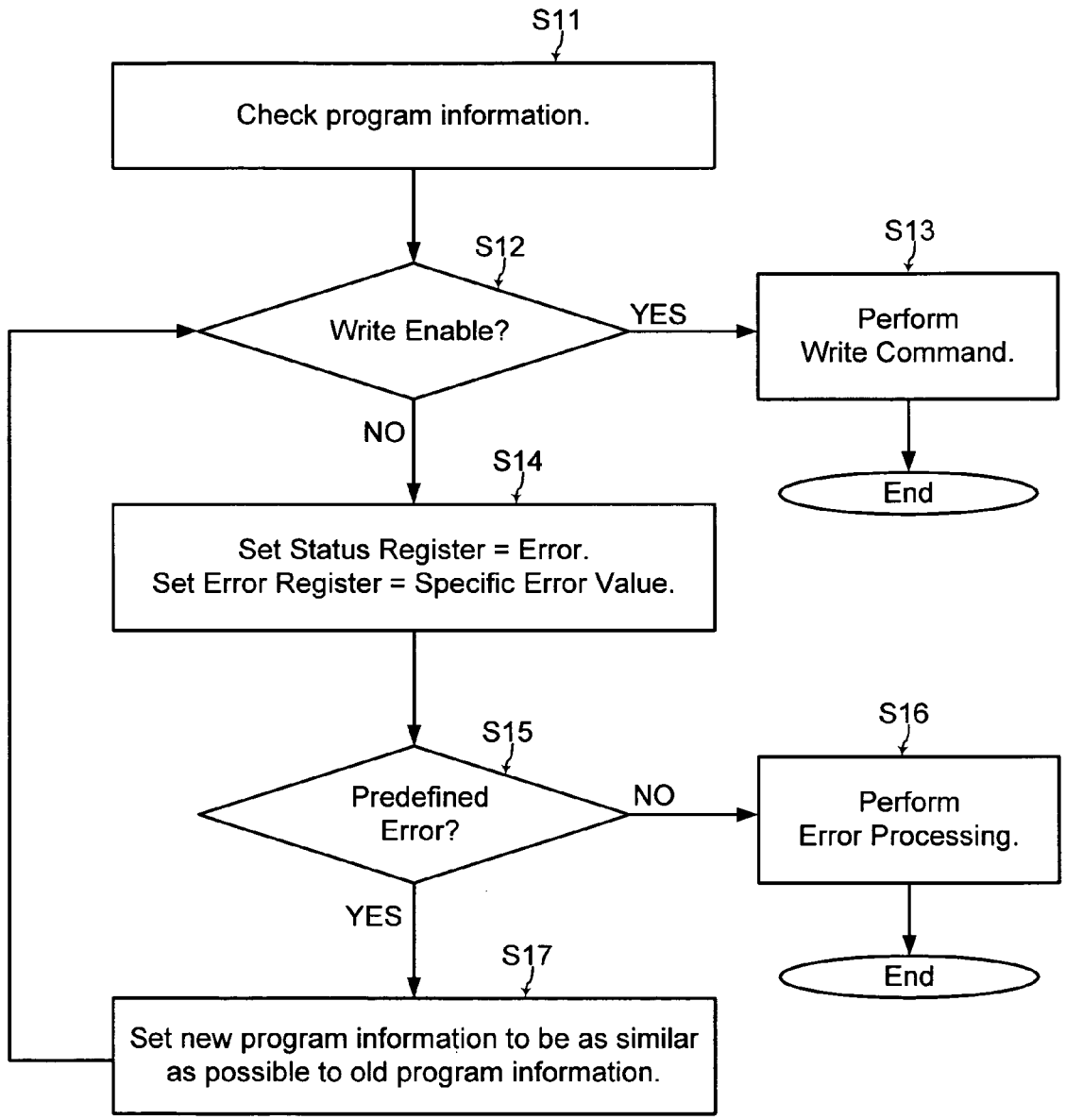
FIG. 23 shows a flowchart of steps during operation of the data storage device of FIG. 12, according to another example embodiment of the present invention.
Figure 24:
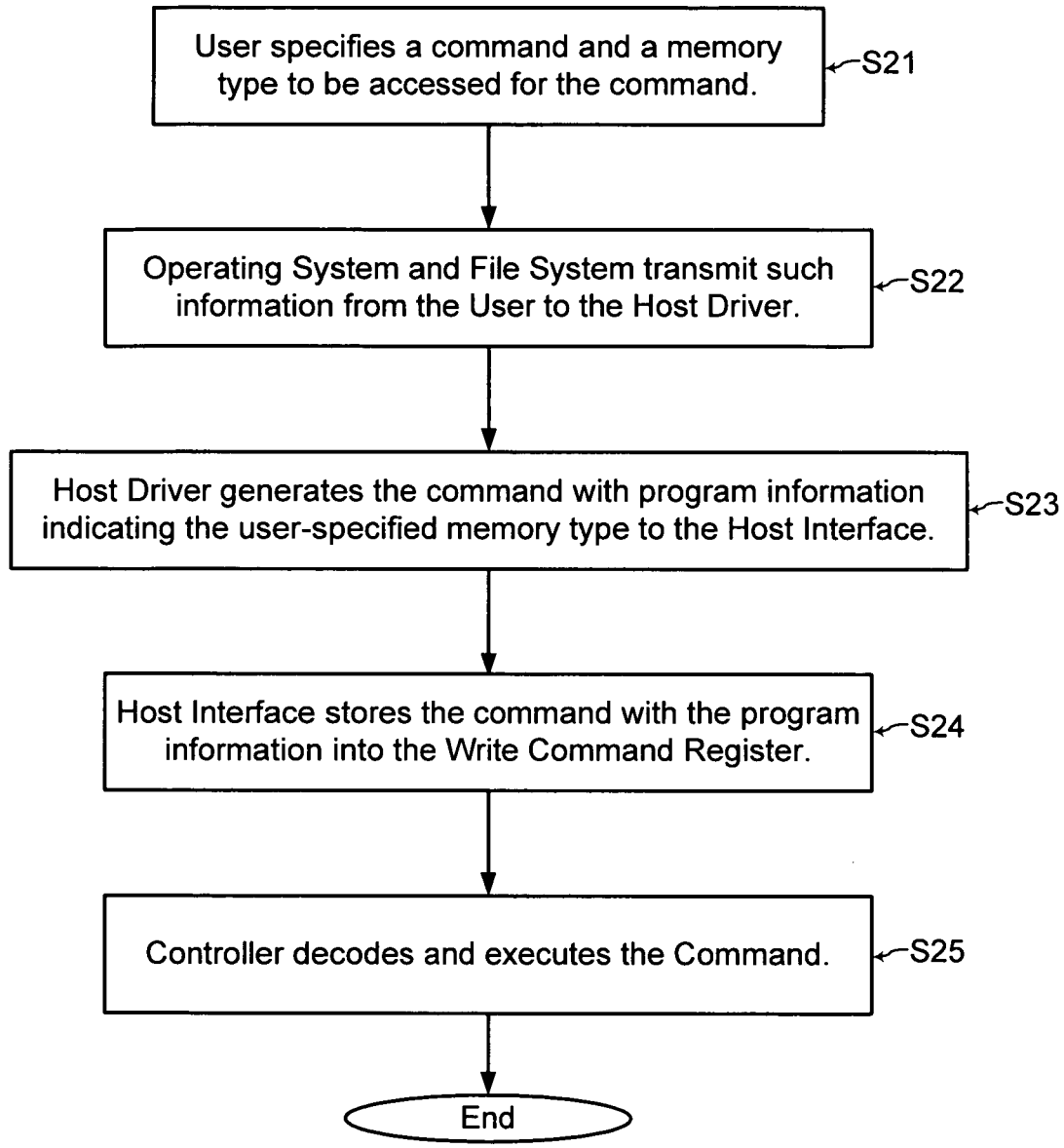
FIG. 24 shows a flowchart of steps during operation of the data storage device of FIG. 12, according to a further example embodiment of the present invention.

FIG. 23 shows a flowchart of more detailed steps for executing the command in step S25 of FIG. 24, according to an alternative embodiment of the present invention. Referring to FIGS. 12 and 23, the controller 520 checks the program information as stored in the features field BW1 in the write command register 516 (step S11 of FIG. 23). The controller 520 decodes the bits of the program information to determine which memory type is being accessed for the command (step S11 of FIG. 23), such as according to the table of FIG. 17 for example. The controller 520 further checks for whether the specified memory type is available for access (step S12 of FIG. 23).

For the example of the write command, the controller 520 determines whether the specified memory type has sufficient capacity for storing the data of the write command. If the specified memory type is available for access, a write enable is activated, and the command is performed by accessing the specified memory type (step S13 of FIG. 23) for completion of the command processing.

Alternatively, if the controller 520 determines that the specified memory type is not available for access (step S12 of FIG. 23), the write enable is deactivated, and the controller 520 indicates an error in the read command register 518 (step S14 of FIG. 23). For example, the controller 520 sets the status name BR7 field of the read command register 518 to indicate that an error for the command has occurred (step S14 of FIG. 23). In addition, the controller 520 sets the error type BR1 field to a specific error value for indicating that the memory type is not available (step S14 of FIG. 23).

If the error type BR1 field indicates an error different from a predefined error that the specified memory type is not accessible (step S15 of FIG. 23), the controller 520 or the host 502 performs error processing for that error type that is not the predefined error (step S16 of FIG. 23) for completion of the command processing. Alternatively, if the error type BR1 field indicates the predefined error that the specified memory type is not accessible, the controller 520 sets new program information to be as similar as possible to the prior program information.

For example, if the former specified memory type corresponding to the prior program information is not available for access (step S15 of FIG. 23), the controller 520 sets the new program information to correspond to a new specified memory type that is as similar as possible to the prior specified memory type (step S17 of FIG. 23). For instance, assume that the prior program information corresponds to the 2-bits MLC portion of the flash memory device 522 and that such specified memory type is not available for access. In that case, the controller 520 sets the new program information to correspond to the 3-bits MLC portion of the flash memory device 522 because the 3-bits MLC portion of the flash memory device 522 is most similar to the 2-bits MLC portion of the flash memory device 522 in terms of reliability, speed, and memory capacity.

The controller 520 sets such new program information to the features field BW1 of the write command register 516 (step S17 of FIG. 23). The flowchart of FIG. 23 then returns to step S11 to be performed with the new program information in the write command register 516. In this manner in FIG. 23, the controller 520 specifies a series of memory types until a specified memory type is available for access for the current command.

In this manner, the user 506 has the capability to specify the memory type to be accessed for a command by entering the program information into the command. The controller 520 further processes the command depending on whether the selected memory type is available for such access. Thus, the command is processed according to the specification of the user, and the controller 520 further ensures processing of the command according to availability of the memory types.

Figure 20:
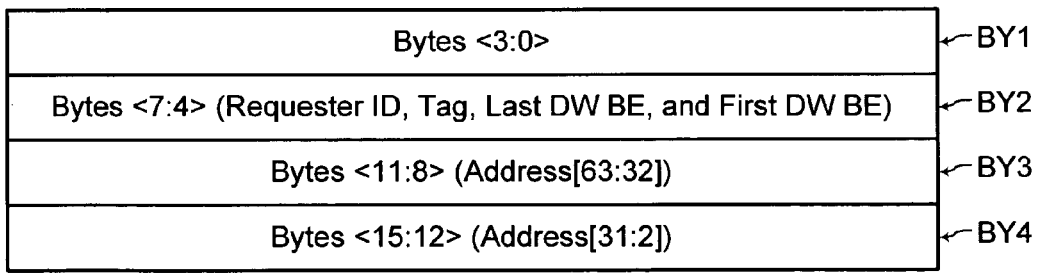
FIGS. 20 and 21 illustrate a structure of a data packet sent to the data storage device from the host according to a PCI express interface standard, according to example embodiments of the present invention.

The foregoing is by way of example only and is not intended to be limiting. For example, the present invention may be practiced with the program information being entered into any unused or reserved field of a command in other data interface standards. For example, FIG. 20 shows a data packet 600 transmitted according to a PCI (peripheral component interconnect) Express interface standard. The data packet 600 includes first, second, third, and fourth byte portions BY1, BY2, BY3, and BY4, respectively. Such byte portions BY1, BY2, BY3, and BY4 are generally and individually known to one of ordinary skill in the art of PCI Express.

Figure 21:
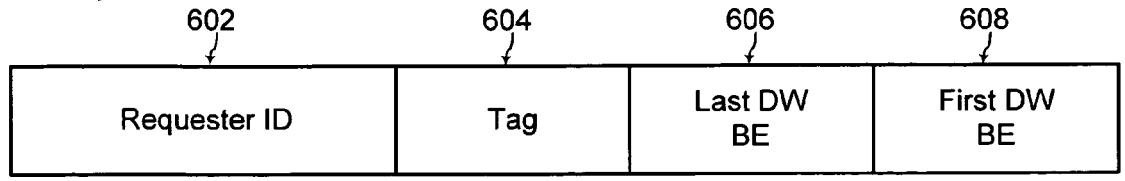

FIG. 21 shows more detailed portions of the second bye portion BY2 with a requester ID 602, a tag 604, a last double word byte enable 606, and a first double word byte enable 608. Such portions are generally and individually known to one of ordinary skill in the art of PCI Express. In the prior art, the last double word byte enable 606 and the first double word byte enable 608 are reserved and not used according to the PCI Express interface standard. According to an aspect of the present invention, the program information for specifying the memory type to be accessed for processing the command with the data packet 600 may be stored into the last and first double word byte enable portions 606 and 608 since such portions are not used in the prior art.

In addition, any number of elements as illustrated and described herein is by way of example only. The present invention is limited only as defined in the following claims and equivalents thereof.

The invention claimed is:

1. A data storage device for processing a command, the data storage device comprising:
   a host interface for storing program information sent within the command from a host, wherein said program information is a bit pattern set by the host in an unused or reserved field instead of an address field of the command according to a data interface standard;
   a controller for decoding the program information that indicates a memory type to be accessed for the command, and wherein the controller determines whether said memory type can be accessed according to the command;
   wherein the controller performs the command by accessing said memory type when the memory type specified by the program information is available for access; and
   a status register for storing an indication of an error when the memory type specified by the program information is not available for access according to the command;
   wherein the host reads said status register with said indication of said error, and wherein the host sends modified program information for indicating an alternative memory type to be accessed for the command after the host reads said error in the status register.

2. A data storage device for processing a command, the data storage device comprising:
   a host interface for storing program information sent within the command from a host, wherein said program information is a bit pattern set by the host in an unused or reserved field instead of an address field of the command according to a data interface standard;
   a controller for decoding the program information that indicates a memory type to be accessed for the command, and wherein the controller determines whether said memory type can be accessed according to the command;
   wherein the controller performs the command by accessing said memory type when the memory type specified by the program information is available for access; and
   a status register for storing an indication of an error when the memory type specified by the program information is not available for access according to the command;
   wherein the controller selects an alternative memory type that is available to be accessed for performing the command when the status register is set to indicate the error, and wherein the controller performs the command by accessing the alternative memory type.

3. The data storage device of claim 2, wherein the status register is a read command register.

4. The data storage device of claim 3, wherein the command is sent from the host to the data storage device via the host interface that is a high speed serial interface, and wherein the read command register is within the high speed serial interface.

5. The data storage device of claim 2, wherein the program information is stored in a features field within a write command register.

6. The data storage device of claim 5, wherein the command is sent from the host to the data storage device via the host interface that is a high speed serial interface, and wherein the write command register is within the high speed serial interface.

7. The data storage device of claim 6, wherein the high speed serial interface is for one of a SATA interface, a SAS interface, or a PCI express interface.

8. The data storage device of claim 2, wherein the program information is embedded into a reserved field of a data packet sent from the host according to a PCI express interface standard.

9. The data storage device of claim 2, wherein the program information indicates access to one of a plurality of MLC (multi level cell) flash memory types or a SLC (signal level cell) flash memory type within a solid state drive.

10. The data storage device of claim 2, wherein the program information indicates access to one of a SLC (signal level cell) flash memory type, a plurality of MLC (multi level cell) flash memory types, or a random access memory type for the command.

11. A method for processing a command in a data storage device, comprising:
    decoding the command having program information indicating a memory type to be accessed for the command, wherein said program information is a bit pattern set by a host in an unused or reserved field instead of an address field of the command according to a data interface standard;
    determining whether said memory type can be accessed according to the command;
    performing the command by accessing said memory type when the memory type specified by the program information is available for access;
    indicating an error when the memory type specified by the program information is not available for access according to the command;
    setting a status register to indicate said error;
    reading by the host said status register with said indication of said error, wherein the host generated said command; and
    sending by the host modified program information for indicating an alternative memory type to be accessed for the command, after the host reads said error in the status register.

12. A method for processing a command in a data storage device, comprising:
    decoding the command having program information indicating a memory type to be accessed for the command, wherein said program information is a bit pattern set by a host in an unused or reserved field instead of an address field of the command according to a data interface standard;
    determining whether said memory type can be accessed according to the command;
    performing the command by accessing said memory type when the memory type specified by the program information is available for access;
    indicating an error when the memory type specified by the program information is not available for access according to the command;
    setting a status register to indicate said error;
    selecting an alternative memory type that is available to be accessed for performing the command when the status register is set to indicate the error; and
    performing the command by accessing the alternative memory type.

13. The method of claim 12, wherein the status register is a read command register.

14. The method of claim 13, wherein the command is sent from the host to the data storage device via a host interface that is a high speed serial interface, and wherein the read command register is within the high speed serial interface.

15. The method of claim 12, wherein the program information is stored in a features field within a write command register.

16. The method of claim 15, wherein the command is sent from the host to the data storage device via a host interface that is a high speed serial interface, and wherein the write command register is within the high speed serial interface.

17. The method of claim 16, wherein the high speed serial interface is for one of a SATA interface, a SAS interface, or a PCI express interface.

18. The method of claim 12, wherein the program information is embedded into a reserved field of a data packet sent from the host according to a PCI express interface standard.

19. The method of claim 12, wherein the program information indicates access to one of a plurality of MLC (multi level cell) flash memory types or a SLC (signal level cell) flash memory type within a solid state drive.

20. The method of claim 12, wherein the program information indicates access to one of a SLC (signal level cell) flash memory type, a plurality of MLC (multi level cell) flash memory types, or a random access memory type.

\* \* \* \* \*